(12) United States Patent
Nguyen et al.

(10) Patent No.: US 10,129,016 B2
(45) Date of Patent: Nov. 13, 2018

(54) DATA SERIALIZER

(71) Applicant: FINISAR CORPORATION, Sunnyvale, CA (US)

(72) Inventors: The'Linh Nguyen, San Jose, CA (US); Daniel K. Case, Gilroy, CA (US)

(73) Assignee: FINISAR CORPORATION, Sunnyvale, CA (US)

( * ) Notice: Subject to any disclaimer, the term of this patent is extended or adjusted under 35 U.S.C. 154(b) by 98 days.

(21) Appl. No.: 14/542,251

(22) Filed: Nov. 14, 2014

(65) Prior Publication Data

US 2015/0139252 A1 May 21, 2015

Related U.S. Application Data

(60) Provisional application No. 61/905,645, filed on Nov. 18, 2013.

(51) Int. Cl.
*H04L 7/033* (2006.01)
*H04J 3/06* (2006.01)
(Continued)

(52) U.S. Cl.
CPC .......... *H04L 7/0331* (2013.01); *H03L 7/0807* (2013.01); *H03M 9/00* (2013.01);
(Continued)

(58) Field of Classification Search
CPC ..... H04L 7/0331; H04L 7/0041; H04L 25/14; H03L 7/0807; H03M 9/00; H04J 3/047; H04J 3/0635
See application file for complete search history.

(56) References Cited

U.S. PATENT DOCUMENTS 7,307,558 B1 12/2007 Karim et al.
2004/0136411 A1 7/2004 Hornbuckle et al.
(Continued)

FOREIGN PATENT DOCUMENTS

CN 1505289 A 6/2004
CN 1601547 A 3/2005
(Continued)

OTHER PUBLICATIONS

Messerschmitt, David G. Frequency Detectors for PLL Acquistion in Timing and Carrier Recovery. IEEE Transactions on Communications vol. Com-27, No. 9 Sep. 1979.*
(Continued)

*Primary Examiner* — Jeffrey M Rutkowski
*Assistant Examiner* — Basil Ma
(74) *Attorney, Agent, or Firm* — Maschoff Brennan

(57) ABSTRACT

A serializer circuit may include a recovery circuit, an adjusting circuit, and a multiplexer circuit. The recovery circuit may be configured to receive a first data signal at a first frequency, to generate a first clock signal at the first frequency using the first data signal, and to retime the first data signal based on the first clock signal to generate a retimed first data signal. The adjusting circuit may be configured to receive a second data signal and retime the second data signal based on the first clock signal to generate a retimed second data signal. The multiplexer circuit may be configured to multiplex the retimed first data signal and the retimed second data signal.

18 Claims, 7 Drawing Sheets

(51) Int. Cl.
*H04L 7/00* (2006.01)
*H04L 25/14* (2006.01)
*H04J 3/04* (2006.01)
*H03L 7/08* (2006.01)
*H03M 9/00* (2006.01)

(52) U.S. Cl.
CPC ............ *H04J 3/047* (2013.01); *H04J 3/0635* (2013.01); *H04L 7/0041* (2013.01); *H04L 25/14* (2013.01); *H04L 7/033* (2013.01)

(56) References Cited

U.S. PATENT DOCUMENTS

| | | |
|---|---|---|
| 2008/0107422 A1 | 5/2008 | Cole |
| 2009/0074407 A1* | 3/2009 | Hornbuckle ......... H04B 10/532 398/43 |
| 2012/0314825 A1 | 12/2012 | Dillinger |

FOREIGN PATENT DOCUMENTS

| | | |
|---|---|---|
| CN | 101573903 A | 11/2009 |
| CN | 101697488 A | 4/2010 |
| CN | 106341153 A | 1/2017 |

OTHER PUBLICATIONS

International Search Report and Written Opinion dated Jan. 23, 2015 in related PCT Application No. PCT/US2014/066208 (11 pgs.).

Shi et al., "5 Gb/s 2:1 fully-integrated full-rate multiplexer with on-chip clock generation circuit in 0.18-µm CMOS", Analog Integrated Circuits and Signal Processing (2012) 72: 469-480, published May 4, 2012, DOI: 10.1007/s10470-012-9859-y (12 pgs.).

\* cited by examiner

DATA SERIALIZER

FIELD

The embodiments discussed herein are related to a data serializer.

BACKGROUND

A data serializer is an electronic circuit that is used to connect a parallel data bus to a more narrow parallel data bus or serial data bus. In general, a parallel data bus may include a relatively large number of data bits to transmit a data word in parallel fashion, with two or more of the data bits being transmitted simultaneously. The narrow parallel data bus or serial data bus may include a relatively few number of data lines, such as one, to transmit the same data word in a more serial fashion, where the data word is transmitted in several smaller pieces, one after another. The narrow parallel data bus or serial data bus may operate at a higher frequency than the parallel data bus so that the same amount of data may pass through the busses in a given period.

In a typical embodiment, a data serializer may receive data from a parallel circuit bus at a low frequency and convert the data into a high-frequency data stream having fewer parallel bits than the parallel circuit bus. To convert the data, the data serializer may receive a data word from parallel circuit bus, divide the data word into several pieces, and transmit those pieces one by one on the narrow data bus, generally, before the next data word is available from the parallel circuit bus.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Some example embodiments generally relate to data serializers.

In an example embodiment, a serializer circuit may include a recovery circuit, an adjusting circuit, and a multiplexer circuit. The recovery circuit may be configured to receive a first data signal at a first frequency, to generate a first clock signal at the first frequency using the first data signal, and to retime the first data signal based on the first clock signal to generate a retimed first data signal. The adjusting circuit may be configured to receive a second data signal and retime the second data signal based on the first clock signal to generate a retimed second data signal. The multiplexer circuit may be configured to multiplex the retimed first data signal and the retimed second data signal.

In yet another example embodiment, a method of serializing data signals is disclosed. The method may include receiving a first data signal at a first frequency and a second data signal. The method may also include generating a first clock signal at the first frequency using the first data signal and retiming the first data signal based on the first clock signal to generate a retimed first data signal. The method may further include retiming the second data signal based on the first clock signal to generate a retimed second data signal and multiplexing the retimed first data signal and the retimed second data signal.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Some embodiments disclosed herein relate to a data serializer circuit configured to serialize parallel data signals to generate a serial data signal. To serialize the parallel data signals, in some embodiments, the data serializer may include a recovery circuit, an adjusting circuit, and a multiplexer circuit. The recovery circuit may be configured to receive a first data signal at a first frequency, to generate a first clock signal at the first frequency using the first data signal, and to retime the first data signal based on the first clock signal to generate a retimed first data signal. The adjusting circuit may be configured to receive a second data signal and retime the second data signal based on the first clock signal to generate a retimed second data signal. The multiplexer circuit may be configured to multiplex the retimed first data signal and the retimed second data signal based on a second clock signal to generate the serial data signal. The second clock signal may be generated by the recovery circuit and may have a frequency greater than the first clock signal but may be phase aligned with the first clock signal such that the second clock signal is phase aligned with the retimed first and second data signals.

Figure 1:
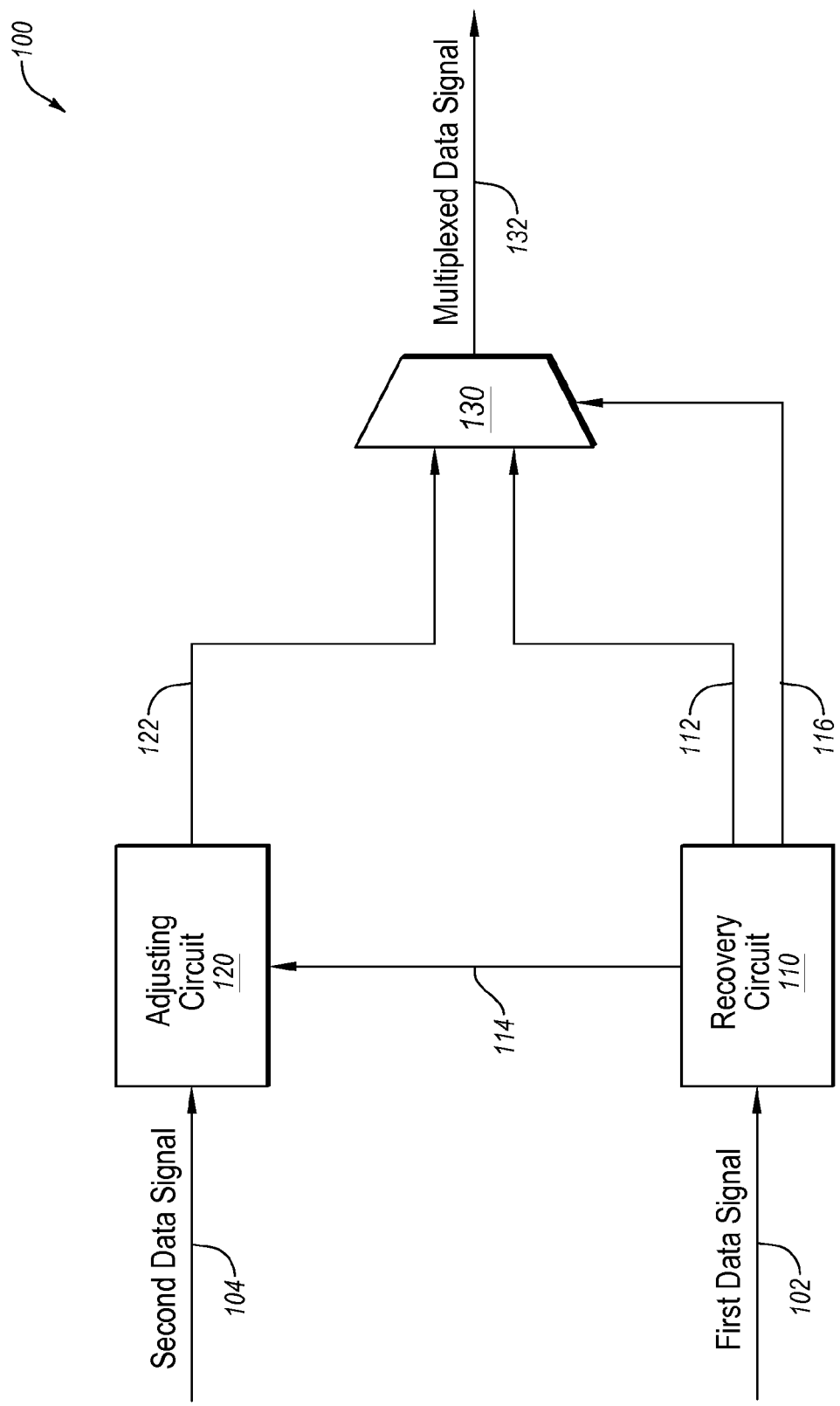
FIG. 1 illustrates an example serializer circuit.

FIG. 1 illustrates an example serializer circuit 100, arranged in accordance with at least one embodiment described herein. In general, the serializer circuit 100 may be configured to serialize parallel data signals. Under some circumstances, the parallel data signals may have similar or identical frequencies but different phases. The serializer circuit 100 may be configured to align the phases of the data signals and, after aligning the data signals, to multiplex the phase aligned data signals to serialize the data signals.

The serializer circuit 100 may include a recovery circuit 110, an adjusting circuit 120, and a multiplexer circuit 130. The recovery circuit 110, the multiplexer circuit 130, and the adjusting circuit 120 may be communicatively coupled, electrically coupled, or both communicatively and electrically coupled.

The recovery circuit 110 may be configured to receive a first data signal 102. The first data signal 102 may have a first frequency. Using the first data signal 102, the recovery circuit 110 may be configured to generate a first clock signal 114 that has a frequency similar or identical to the frequency of the first data signal 102. The first clock signal 114 may be provided to the adjusting circuit 120.

The recovery circuit 110 may also be configured to retime the first data signal 102 based on the first clock signal 114 to generate a retimed first data signal 112 that is provided to the multiplexer circuit 130. The retimed first data signal 112 may be phase aligned with the first clock signal 114 such that the retimed first data signal 112 and the first clock signal 114 have a known phase relationship. For example, the retimed first data signal 112 may be phase aligned with the first clock signal 114 such that a rising or falling edge of the first clock signal 114 occurs between transitions of the retimed first data signal 112. In some embodiments, the retimed first data signal 112 may be phase aligned with the first clock signal 114 such that a rising edge of the first clock signal 114 may occur halfway between transitions of the retimed first data signal 112.

The recovery circuit 110 may also be configured to generate a second clock signal 116 that is provided to the multiplexer circuit 130. The second clock signal 116 may have a frequency that is greater than the frequency of the first clock signal 114. The second clock signal 116 may also be phase aligned with the retimed first data signal 112 in a similar manner in which the retimed first data signal 112 is phase aligned with the first clock signal 114. For example, the retimed first data signal 112 may be phase aligned with the second clock signal 116 such that a rising edge of the second clock signal 116 may occur halfway between transitions of the retimed first data signal 112. As a result, in some embodiments, the first clock signal 114 and the second clock signal 116 may have approximately the same or the same phase relationship even though they do not have the same frequencies.

The second clock signal 116 may have a frequency that is related to the frequency of the first data signal 102, and thus the frequency of the first clock signal 114, and to a number of data signals being multiplexed together by multiplexer circuits in the serializer circuit 100. In particular, the frequency of the second clock signal 116 may be a multiple of the frequency of the first clock signal 114. The multiple of the frequency selected may be based on a number of data signals being multiplexed together by the same multiplexer circuit or different multiplexer circuits in the serializer circuit 100. For example, the multiplexer circuit 130 may multiplex two data signals together. As a result, the frequency of the second clock signal 116 may be twice the frequency of the first clock signal 114. As another example, if the multiplexer circuit 130 was multiplexing four data signals, the second clock signal 116 may have a frequency that is four times the frequency of the first clock signal 114.

The adjusting circuit 120 may be configured to receive a second data signal 104 and the first clock signal 114. The second data signal 104 may have a same frequency as the frequency of the first data signal 102. In some embodiments, the first and second data signals 102 and 104 may be parallel data signals from a parallel data bus. The phase of the second data signal 104 may not be the same as the phase of the first data signal 102.

The adjusting circuit 120 may be configured to retime the second data signal 104 based on the first clock signal 114 to generate a retimed second data signal 122. In particular, the adjusting circuit 120 may be configured to phase align the second data signal 104 to the first clock signal 114 in a similar manner as the retimed first data signal 112 is phase aligned with the first clock signal 114. As a result, the retimed second data signal 122 and the retimed first data signal 112 may be approximately phase aligned or phase aligned. Approximate phase alignment or phase alignment may indicate that when the retimed second data signal 122 and the retimed first data signal 112 carry the same data symbols at the same time that the retimed second data signal 122 and the retimed first data signal 112 may have similar rising and falling edges. The retimed second data signal 122 may be provided to the multiplexer circuit 130.

The multiplexer circuit 130 may be configured to receive the retimed first and second data signals 112 and 122 and the second clock signal 116. Based on the second clock signal 116, the multiplexer circuit 130 may multiplex the retimed first and second data signals 112 and 122 to generate a multiplexed data signal 132. The multiplexed data signal 132 may be a serial data signal that includes the information (e.g., data symbols) from both the first and second data signals 102 and 104. The frequency of the multiplexed data signal 132 may be approximately equal or equal to the frequency of the second clock signal 116. As a result, in the illustrated embodiment, the frequency of the multiplexed data signal 132 may be approximately equal or equal to twice the frequency of the first and second data signals 102 and 104.

Modifications, additions, or omissions may be made to the serializer circuit 100 without departing from the scope of the present disclosure. For example, the serializer circuit 100 may receive multiple parallel data signals and include multiple adjusting circuits that are each configured to receive one of the multiple data signals and the first clock signal 114. Each of the multiple adjusting circuits may be configured to generate retimed data signals that are phase aligned so that a multiplexer circuit or the multiplexer circuit 130 may multiplex the retimed data signals together to serialize the parallel data signals.

Figure 2:
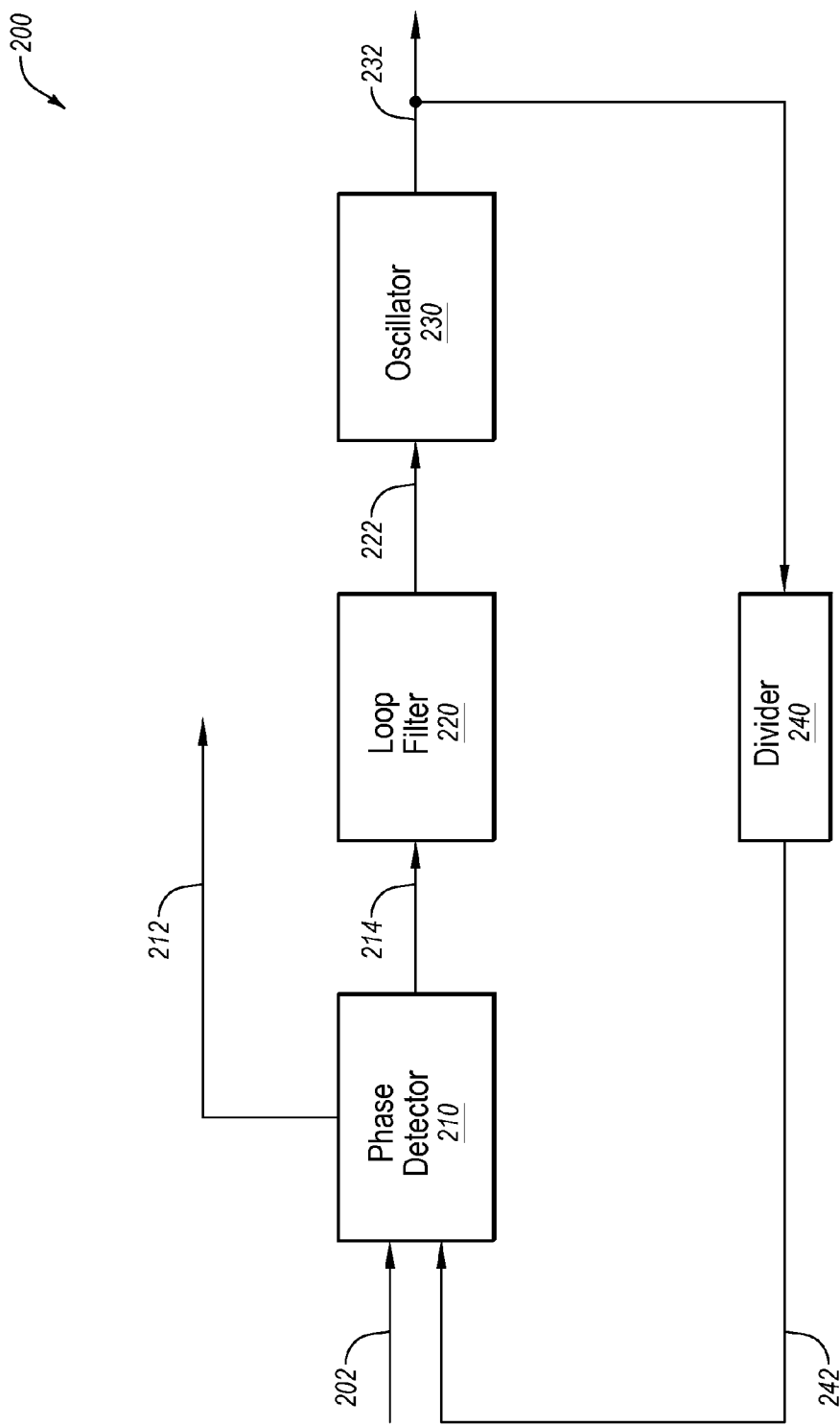
FIG. 2 illustrates an example recovery circuit.

FIG. 2 illustrates an example recovery circuit 200, arranged in accordance with at least one embodiment described herein. In general, the recovery circuit 200 may be configured to receive a data signal 202, generate a clock signal 232 and a divided clock signal 242 using the data signal 202, and retime the data signal 202 based on the divided clock signal 242 to generate a retimed data signal 212.

In some embodiments, the recovery circuit 200 may be analogous to the recovery circuit 110 of FIG. 1. In these embodiments, the data signal 202 may be analogous to the first data signal 102 of FIG. 1, the retimed data signal 212 may be analogous to the retimed first data signal 112 of FIG. 1, the clock signal 232 may be analogous to the second clock signal 116 of FIG. 1, and the divided clock signal 242 may be analogous to the first clock signal 114 of FIG. 1.

The recovery circuit 200 may be a clock and data recovery circuit and may include a phase detector 210, a loop filter 220, an oscillator 230, and a divider 240. The phase detector 210 may be configured to receive the data signal 202 and the divided clock signal 242 from the divider 240. The phase detector 210 may be configured to compare phases of the data signal 202 and the divided clock signal 242. Based on the comparison of the phases of the data signal 202 and the divided clock signal 242, the phase detector 210 may output a phase signal 214. The phase detector 210 may also be configured to retime the data signal 202 based on the divided clock signal 242 and to output a retimed data signal 212. The retimed data signal 212 may be phase aligned with the divided clock signal 242.

In some embodiments, the retimed data signal 212 may be phase aligned with the divided clock signal 242 such that the rising edge of the divided clock signal 242 is between transitions of the retimed data signal 212. In some embodiments, the rising edge of the divided clock signal 242 may be in a center point between transitions of the retimed data signal 212. An example phase detector 210 may be the Alexander phase detector.

The loop filter 220 may be configured to filter the phase signal 214 to generate a filtered phase signal 222. The loop filter 220 may be configured as a digital or analog filter and may be configured to remove higher frequencies or components of the phase signal 214. The filtered phase signal 222 may be provided to the oscillator 230.

The oscillator 230 may be configured to receive the filtered phase signal 222 and to generate a clock signal 232 based on the filtered phase signal 222. In some embodiments, the oscillator 230 may determine a frequency for the clock signal 232 based on the filtered phase signal 222 and one or more other signals, such as a frequency band select signal or other signals. The clock signal 232 may be output by the oscillator 230.

The divider 240 may be configured to receive the clock signal 232 and to divide the clock signal 232 to generate the divided clock signal 242. The frequency of the divided clock signal 242 may be proportional to the frequency of the clock signal 232 based on a divisor of the divider 240. For example, when the divisor is two, the divided clock signal 242 may have a frequency that is one-half the frequency of the clock signal 232. The divider 240 may provide the divided clock signal 242 to the phase detector 210.

As illustrated in FIG. 2 and discussed above, the recovery circuit 200 may be a feedback circuit that operates to generate the clock signal 232 based on the data signal 202. In some embodiments, the recovery circuit 200 may be configured to extract timing of the data signal 202 based on transitions of the data signal 202 to generate the clock signal 232. The frequency of the clock signal 232 may be related to the frequency of the data signal 202 based on the divisor of the divider 240. The recovery circuit 200 may operate to adjust the frequency of the clock signal 232 based on changes to the data signal 202.

Modifications, additions, or omissions may be made to the recovery circuit 200 without departing from the scope of the present disclosure. For example, in some embodiments, the phase detector 210 may not be configured to generate the retimed data signal 212. In these and other embodiments, a delay circuit or some phase adjustment circuit may be configured to adjust the phase of the data signal 202 to retime the data signal 212 using the clock signal 232 or the divided clock signal 242 in a manner analogous to the adjusting circuit discussed with respect to FIG. 3.

Figure 3:
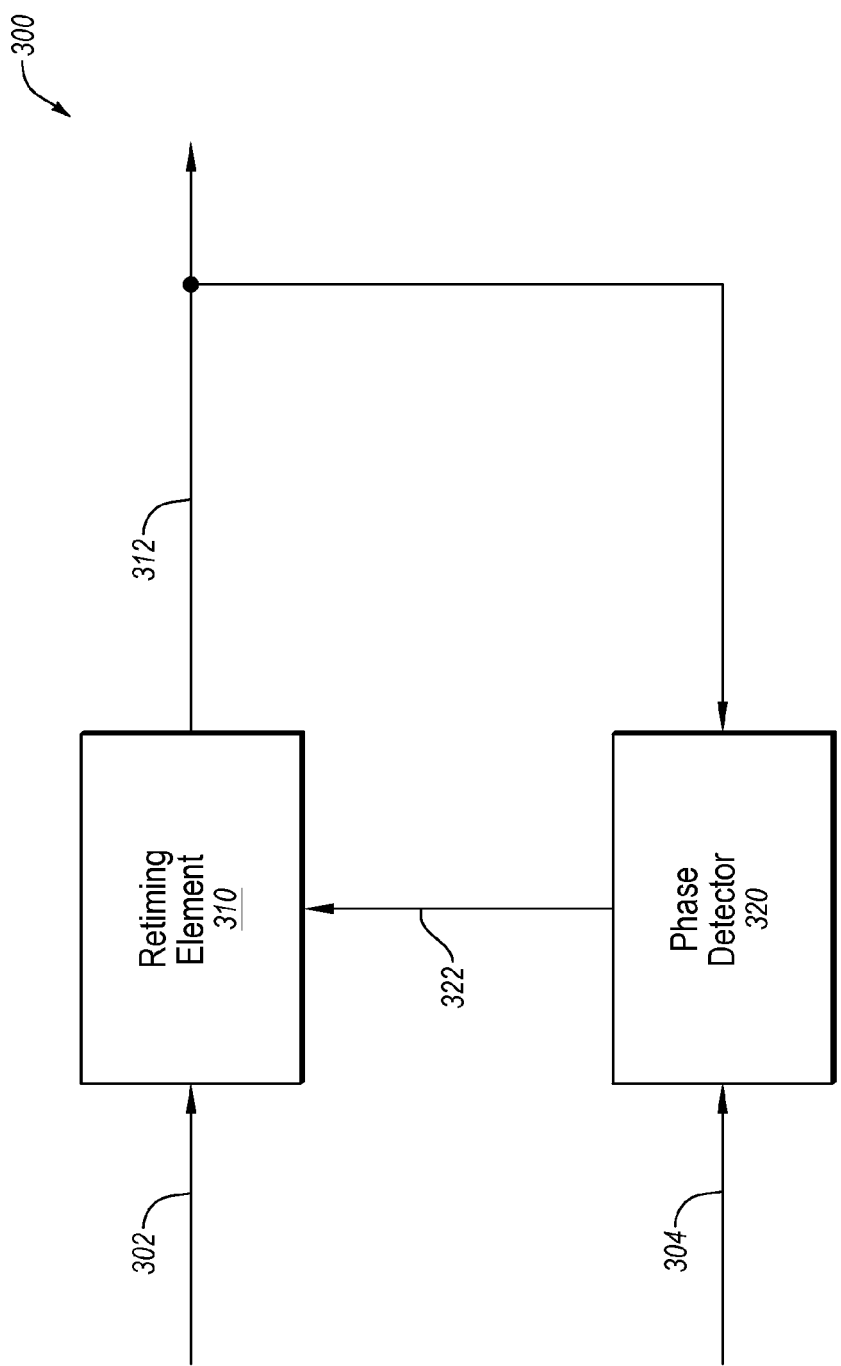
FIG. 3 illustrates an example adjusting circuit.

FIG. 3 illustrates an example adjusting circuit 300, arranged in accordance with at least one embodiment described herein. In general, the adjusting circuit 300 may be configured to receive a data signal 302 and to retime the data signal 302 based on a clock signal 304 to generate a retimed data signal 312.

In some embodiments, the adjusting circuit 300 may be analogous to the adjusting circuit 120 of FIG. 1. In these embodiments, the data signal 302 may be analogous to the second data signal 104 of FIG. 1, the clock signal 304 may be analogous to the first clock signal 114 of FIG. 1, and the retimed data signal 312 may be analogous to the retimed second data signal 122 of FIG. 1.

The adjusting circuit 300 may include a retiming element 310 and a phase detector 320. The retiming element 310 may be configured to receive the data signal 302 and a phase comparison signal 322 and to generate the retimed data signal 312 based on the data signal 302 and the phase comparison signal 322. In some embodiments, the retiming element 310 may be configured to adjust the phase of the data signal 302 to generate the retimed data signal 312. In some embodiments, the retiming element 310 may be a delay element configured to adjust the phase of the data signal 302 by varying an amount that the data signal 302 is delayed. In these and other embodiments, the retiming element 310 may determine an amount to delay the data signal 302 based on the phase comparison signal 322. The retiming element 310 may provide the retimed data signal 312 to the phase detector 320.

The phase detector 320 may be configured to receive the retimed data signal 312 and the clock signal 304. The phase detector 320 may compare the phases of the retimed data signal 312 and the clock signal 304 and based on the comparison generate the phase comparison signal 322. The phase comparison signal 322 may indicate an amount to adjust the phase of the retimed data signal 312 so that the retimed data signal 312 and the clock signal 304 are phase aligned or approximately phase aligned. The retimed data signal 312 and the clock signal 304 may be phase aligned or approximately phase aligned when the retimed data signal 312 and the clock signal 304 have a known phase relationship. In some embodiments, the retimed data signal 312 and the clock signal 304 may be phase aligned or approximately phase aligned when the rising edge of the clock signal 304 is near a center point between transitions of the retimed data signal 312.

The adjusting circuit 300 may operate using the feedback configuration illustrated in FIG. 3 to maintain a constant or approximately constant phase relationship between the clock signal 304 and the retimed data signal 312. Modifications, additions, or omissions may be made to the adjusting circuit 300 without departing from the scope of the present disclosure.

Figure 4:
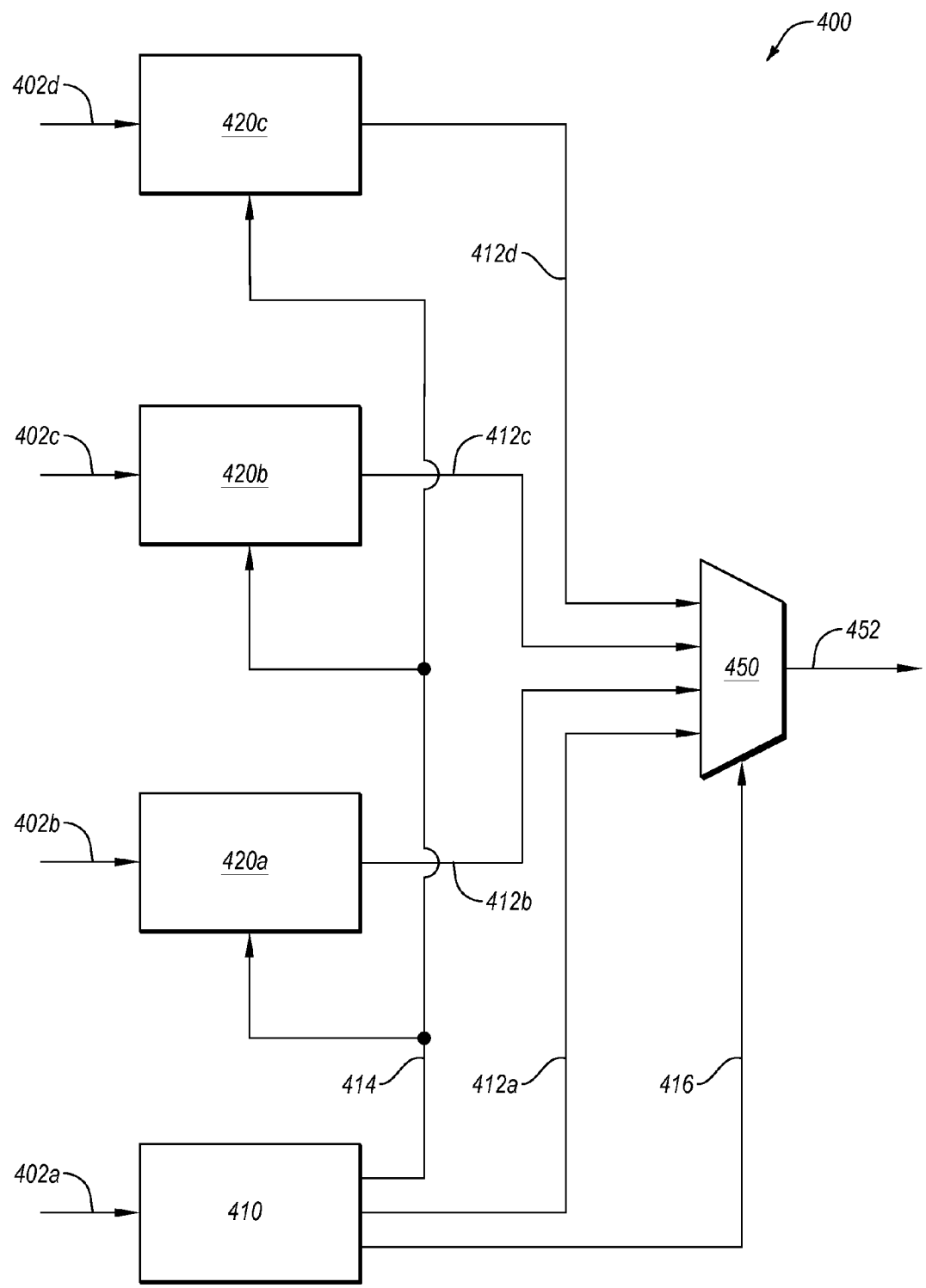
FIG. 4 illustrates another example serializer circuit.

FIG. 4 illustrates another example serializer circuit 400, arranged in accordance with at least one embodiment described herein. In general, the serializer circuit 400 may be configured to receive parallel first, second, third, and fourth data signals 402a, 402b, 402c, and 402d (referred to herein collectively as the parallel data signals 402) and to serialize the parallel data signals 402. The parallel data signals 402 may have identical or approximately identical frequencies but different phases with respect to one another. The serializer circuit 400 may be configured to align the phases of the parallel data signals 402 and, after aligning the parallel data signals 402, to multiplex the phase aligned data signals 402 to serialize the parallel data signals 402.

The serializer circuit 400 may include a recovery circuit 410, first, second, and third adjusting circuits 420a, 420b, and 420c (referred to herein as the adjusting circuits 420), and a multiplexer circuit 450. In some embodiments, the recovery circuit 410 may be analogous to the recovery circuits 110 and/or 200 of FIGS. 1 and 2, the adjusting circuits 420 may be analogous to the adjusting circuits 120 and/or 300 of FIGS. 1 and 3, and the multiplexer circuit 450 may be analogous to the multiplexer circuit 130 of FIG. 1.

The recovery circuit 410 may be configured to receive the first data signal 402a. Using the first data signal 402a, the recovery circuit 410 may be configured to generate a first clock signal 414 that has a frequency similar or identical to the frequency of the first data signal 402a. The first clock signal 414 may be provided to the adjusting circuits 420.

The recovery circuit 410 may also be configured to retime the first data signal 402a based on the first clock signal 414 to generate a retimed first data signal 412a that is provided to the multiplexer circuit 450. The retimed first data signal 412a may be phase aligned with the first clock signal 414 such that the retimed first data signal 412a and the first clock signal 414 have a known phase relationship. The recovery circuit 410 may also be configured to generate a second clock signal 416 that is provided to the multiplexer circuit 450. The second clock signal 416 may have a frequency that is four times the frequency of the first clock signal 414.

The first, second, and third adjusting circuits 420a, 420b, and 420c may be configured to receive the second, third, and fourth data signals 402b, 402c, and 402d, respectively, and the first clock signal 414. Based on the first clock signal 414, each of the adjusting circuits 420 may retime their respective data signals 402. The first adjusting circuit 420a may retime the second data signal 402b to generate the second retimed data signal 412b such that the second retimed data signal 412b is phase aligned with the first clock signal 414. The second adjusting circuit 420b may retime the third data signal 402c to generate the third retimed data signal 412c such that the third retimed data signal 412c is phase aligned with the first clock signal 414. The third adjusting circuit 420c may retime the fourth data signal 402d to generate the fourth retimed data signal 412d such that the fourth retimed data signal 412d is phase aligned with the first clock signal 414.

The multiplexer circuit 450 may be configured to receive the second clock signal 416 from the recovery circuit 410 and the retimed data signals 412 from the adjusting circuits 420. In these and other embodiments, the second clock signal 416 may be phase aligned with the retimed data signals 412 but have a frequency that is four times the frequency of the retimed data signals 412. Using the second clock signal 416, the multiplexer circuit 450 may multiplex the retimed data signals 412 to generate a multiplexed signal 452. The multiplexed signal 452 may be a serial data signal that includes the information, such as the data symbols, from the retimed data signals 412. The frequency of the multiplexed signal 452 may be approximately equal or equal to the frequency of the second clock signal 416. Modifications, additions, or omissions may be made to the serializer circuit 400 without departing from the scope of the present disclosure.

Figure 5:
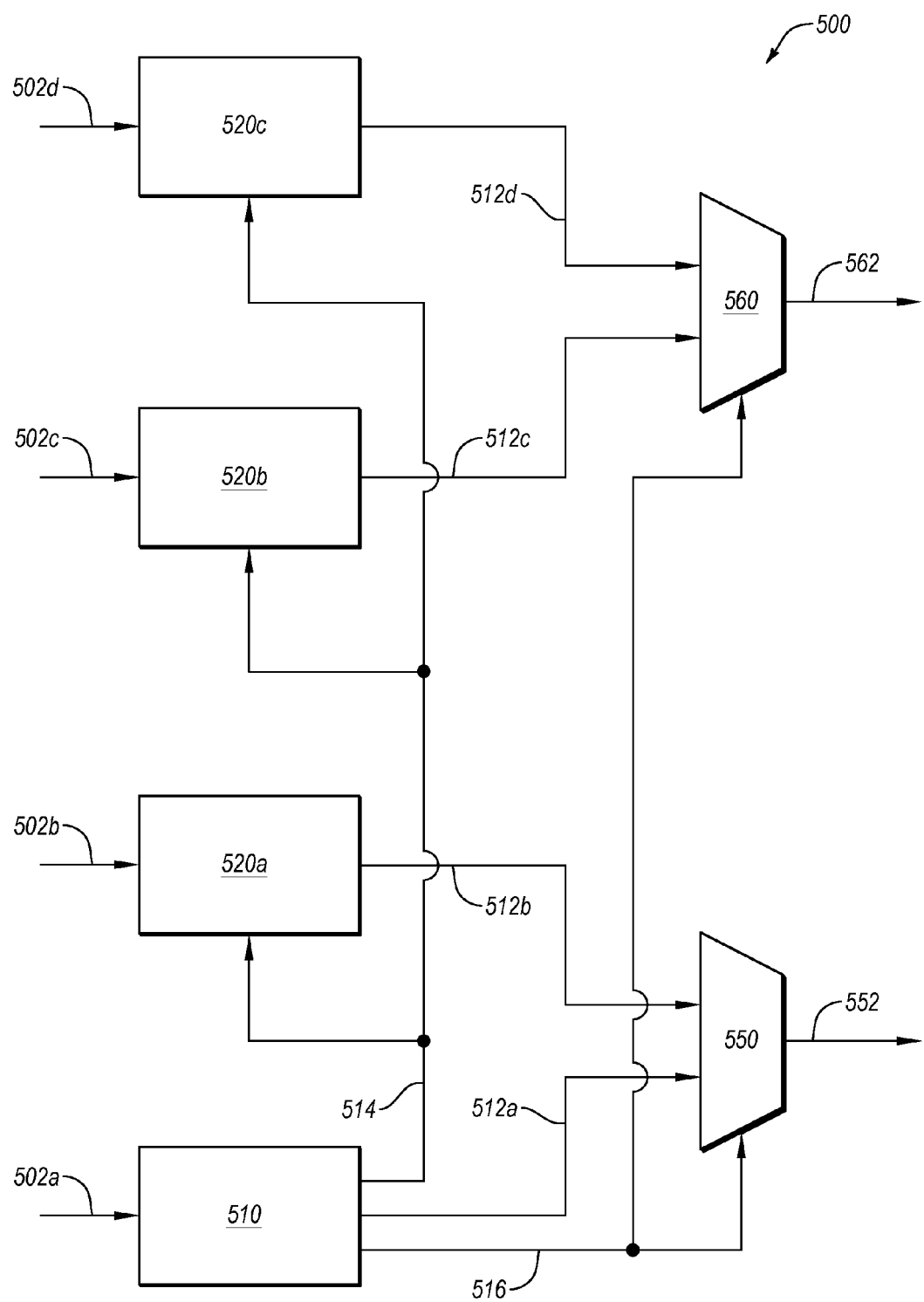
FIG. 5 illustrates another example serializer circuit.

FIG. 5 illustrates another example serializer circuit 500, arranged in accordance with at least one embodiment described herein. In general, the serializer circuit 500 may be configured to receive parallel first, second, third, and fourth data signals 502a, 502b, 502c, and 502d (referred to herein collectively as the data signals 502) and to serialize the parallel data signals 502. The data signals 502 may have a similar frequency but different phases with respect to one another. The serializer circuit 500 may be configured to align the phases of the data signals 502 and, after aligning the data signals 502, to multiplex the phase aligned data signals 502 to serialize the data signals 502.

The serializer circuit 500 may include a recovery circuit 510, a first, second, and third adjusting circuits 520a, 520b, and 520c (referred to herein collectively as the adjusting circuits 520), a first multiplexer circuit 550, and a second multiplexer circuit 560. In some embodiments, the recovery circuit 510 may be analogous to the recovery circuits 110, 200, and/or 410 of FIGS. 1, 2, and 4, the adjusting circuits 520 may be analogous to the adjusting circuits 120, 300, and/or 420 of FIGS. 1, 3, and 4, and the first and second multiplexer circuits 550 and 560 may be analogous to the multiplexer circuit 130 and/or 450 of FIGS. 1 and 4.

The recovery circuit 510 may be configured to receive the first data signal 502a. Using the first data signal 502a, the recovery circuit 510 may be configured to generate a first clock signal 514 that has a frequency similar or identical to the frequency of the first data signal 502a. The first clock signal 514 may be provided to the adjusting circuits 520.

The recovery circuit 510 may also be configured to retime the first data signal 502a based on the first clock signal 514 to generate a retimed first data signal 512a that is provided to the first multiplexer circuit 550. The retimed first data signal 512a may be phase aligned with the first clock signal 514 such that the retimed first data signal 512a and the first clock signal 514 have a known phase relationship. The recovery circuit 510 may also be configured to generate a second clock signal 516 that is provided to the first and second multiplexer circuits 550 and 560. The second clock signal 516 may have a frequency that is two times the frequency of the first clock signal 514.

The first, second, and third adjusting circuits 520a, 520b, and 520c may be configured to receive the second, third, and fourth data signals 502b, 502c, and 502d, respectively, and the first clock signal 514. Based on the first clock signal 514, each of the adjusting circuits 520 may retime their respective data signals 502. The first adjusting circuit 520a may retime the second data signal 502b to generate the second retimed data signal 512b such that the second retimed data signal 512b is phase aligned with the first clock signal 514. The second adjusting circuit 520b may retime the third data signal 502c to generate the third retimed data signal 512c such that the third retimed data signal 512c is phase aligned with the first clock signal 514. The third adjusting circuit 520c may retime the fourth data signal 502d to generate the retimed fourth data signal 512d such that the retimed fourth data signal 512d is phase aligned with the first clock signal 514.

The first multiplexer circuit 550 may be configured to receive the second clock signal 516 and the first retimed data signal 512a from the recovery circuit 510 and the second retimed data signal 512b from the first adjusting circuit 520a. Based on the second clock signal 516, the first multiplexer circuit 550 may multiplex the first and second retimed data signals 512a and 512b to generate a first multiplexed signal 552. The first multiplexed signal 552 may be a serial data signal that includes the information from the first and second retimed data signals 512a and 512b. The frequency of the first multiplexed signal 552 may be approximately equal or equal to the frequency of the second clock signal 516.

The second multiplexer circuit 560 may be configured to receive the second clock signal 516 from the recovery circuit 510, the third retimed data signal 512c from the second adjusting circuit 520b, and the fourth retimed data signal 512d from the third adjusting circuit 520c. Based on the second clock signal 516, the second multiplexer circuit 560 may multiplex the third and fourth retimed data signals 512c and 512d to generate a second multiplexed signal 562. The second multiplexed signal 562 may be a serial data signal that includes the information from the third and fourth retimed data signals 512c and 512d. The frequency of the second multiplexed signal 562 may be approximately equal or equal to the frequency of the second clock signal 516.

Modifications, additions, or omissions may be made to the serializer circuit 500 without departing from the scope of the present disclosure. For example, the serializer circuit 500 may further include a third multiplexer circuit. The third multiplexer circuit may multiplex the first and second multiplexed signals 552 and 562. In these and other embodiments, the third multiplexer circuit may be clocked by a third clock. The third clock may be twice the frequency of the second clock signal 516 and may be provided by the recovery circuit 510 or another circuit.

Alternately or additionally, the serializer circuit 500 may be configured to serialize multiple other data signals 502. For example, the serializer circuit 500 may be configured to serialize 8, 12, 16, or 20, data signals. For example, when the serializer circuit 500 is configured to serialize eight data signals, the serializer circuit 500 may include seven adjusting circuits 520. Each of the adjusting circuits 520 may be configured to adjust their corresponding data signal based on the first clock signal 514. The serializer circuit 500 may also include additional multiplexer circuits. For example, assuming that each multiplexer circuit is a 2 to 1 multiplexer circuit, the serializer circuit 500 may include seven total multiplexer circuits arranged in a cascading fashion to serialize the eight data signals. A first layer of the cascading multiplexer circuits may include four of the seven multiplexer circuits. These four multiplexer circuits may be clocked using the second clock signal 516 and each may receive and multiplex two of the eight outputs from the adjusting circuits 520 and the recovery circuit 510. A second layer of the cascading multiplexer circuits may include two of the seven multiplexer circuits. These two multiplexer circuits may be clocked using a third clock that operates at a frequency twice that of the second clock signal 516. Each of these two multiplexer circuits may multiplex two of the four outputs from the four multiplexer circuits in the first layer of the cascading multiplexer circuits. A third layer of the cascading multiplexer circuits may include one of the seven multiplexer circuits. This final multiplexer circuit may be clocked using a fourth clock that operates at a frequency four times that of the second clock signal 516 and may multiplex the outputs from the two multiplexer circuits in the second layer of the cascading multiplexer circuits.

Figure 6:
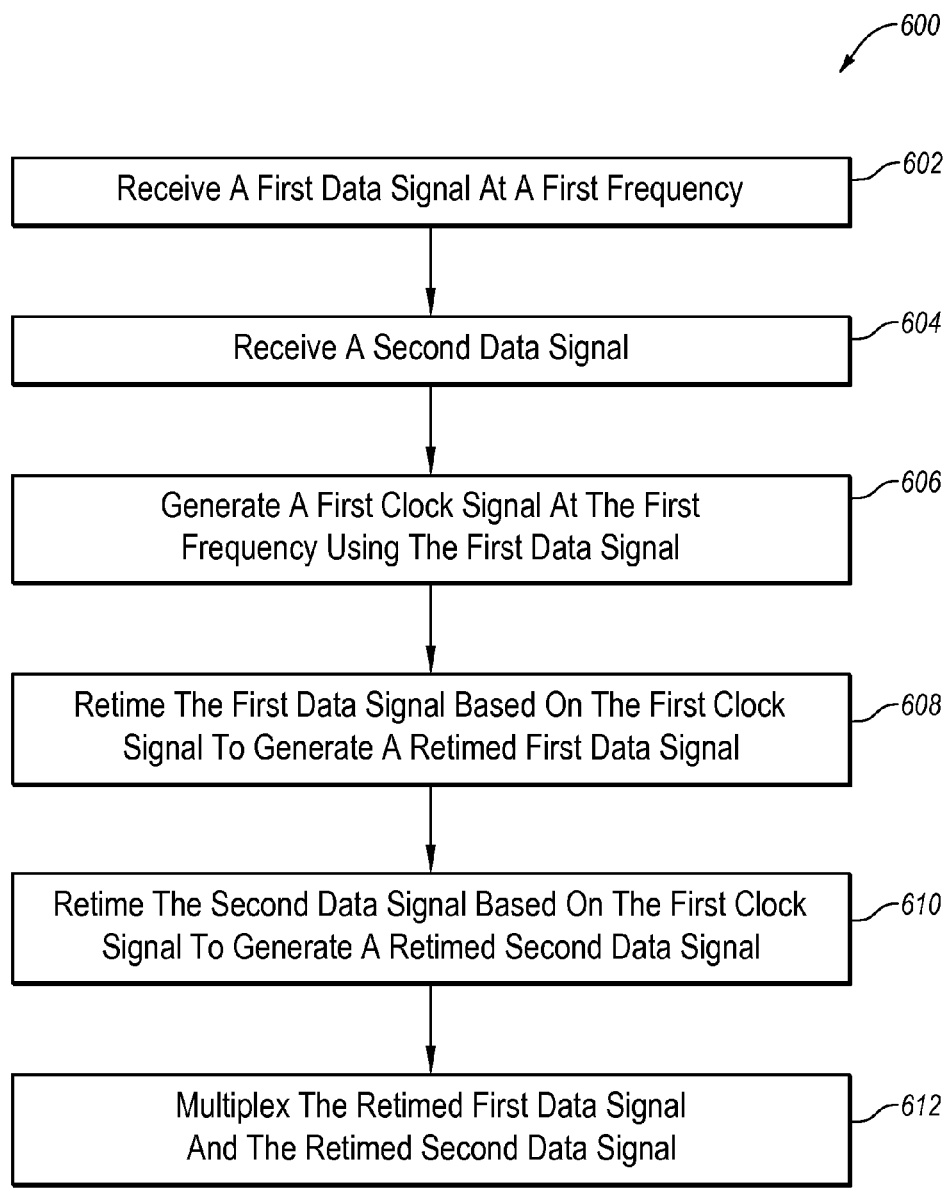
FIG. 6 is a flowchart of an example method of serializing data signals.

FIG. 6 is a flowchart of an example method 600 of serializing a signal, arranged in accordance with at least one embodiment described herein. The method 600 may be implemented, in some embodiments, by a serializer circuit, such as the serializer circuit 100, 400, and/or 500 of FIGS. 1, 4, and 5, respectively. Although illustrated as discrete blocks, various blocks may be divided into additional blocks, combined into fewer blocks, or eliminated, depending on the desired implementation.

The method 600 may begin at block 602, where a first data signal at a first frequency may be received. In block 604, a second data signal may be received.

In block 606, a first clock signal may be generated at the first frequency using the first data signal. In block 608, the first data signal may be retimed based on the first clock signal to generate a retimed first data signal. In some embodiments, the retimed first data signal may be phase aligned with the first clock signal such that either a rising edge or falling edge of the first clock signal is aligned between transitions of the retimed first data signal.

In block 610, the second data signal may be retimed based on the first clock signal to generate a retimed second data signal. In block 612, the retimed first data signal and the retimed second data signal may be multiplexed.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 600 may further include further generating a second clock signal at a second frequency. In some embodiments, the second frequency may be twice the first frequency. In some embodiments, the retimed first data signal and the retimed second data signal may be multiplexed based on the second clock signal.

Alternately or additionally, the method 600 may further include receiving a third data signal and retiming the third data signal based on the first clock signal to generate a retimed third data signal. In some embodiments, the method 600 may further include multiplexing the retimed first data signal, the retimed second data signal, and the retimed third data signal. In some embodiments, the method 600 may further include receiving a third data signal and retiming the third data signal based on the first clock signal to generate a retimed third data signal. The method 600 may further include receiving a fourth data signal, retiming the fourth data signal based on the first clock signal to generate a retimed fourth data signal and multiplexing the retimed third data signal and the retimed fourth data signal.

Figure 7:
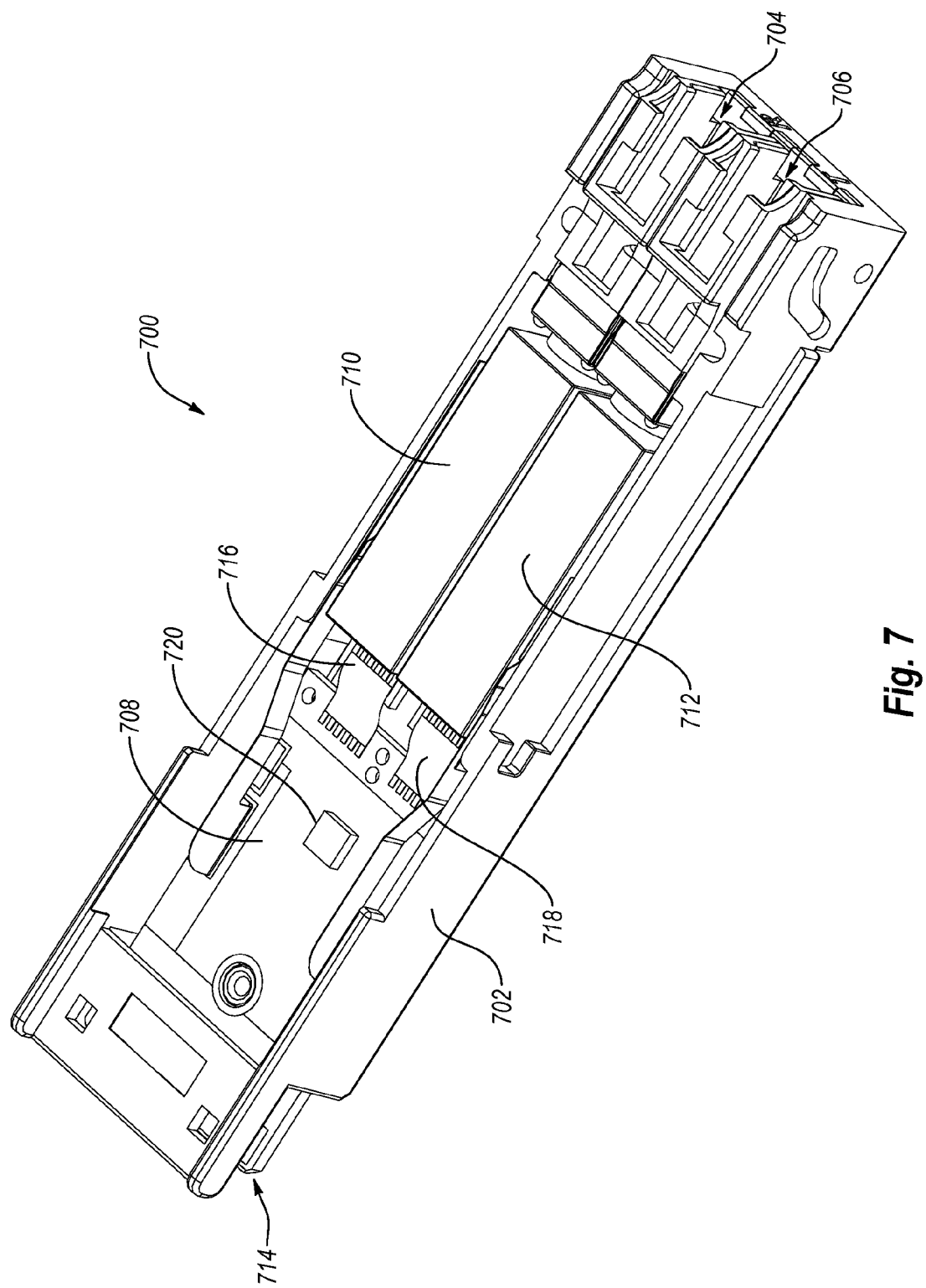
FIG. 7 is a perspective view of an example optoelectronic module that may include a serializer circuit.

FIG. 7 is a perspective view of an example optoelectronic module 700 (hereinafter "module 700") that may include a serializer circuit 720, arranged in accordance with at least one embodiment described herein. The module 700 may be configured for use in transmitting and receiving optical signals in connection with a host device (not shown).

As illustrated, the module 700 may include, but is not limited to, a bottom housing 702, a receive port 704, and a transmit port 706, both defined in the bottom housing 702; a PCB 708 positioned within the bottom housing 702, the PCB 708 having the serializer circuit 720 positioned thereon; and a receiver optical subassembly (ROSA) 710 and a transmitter optical subassembly (TOSA) 712 also positioned within the bottom housing 702. An edge connector 714 may be located on an end of the PCB 708 to enable the module 700 to electrically interface with the host device. As such, the PCB 708 facilitates electrical communication between the host device and the ROSA 710 and TOSA 712.

The module 700 may be configured for optical signal transmission and reception at a variety of data rates including, but not limited to, 1 Gb/s, 10 Gb/s, 20 Gb/s, 40 Gb/s, 100 Gb/s, or higher. Furthermore, the module 700 may be configured for optical signal transmission and reception at various distinct wavelengths using wavelength division multiplexing (WDM) using one of various WDM schemes, such as Coarse WDM, Dense WDM, or Light WDM.

Furthermore, the module 700 may be configured to support various communication protocols including, but not limited to, Fibre Channel and High Speed Ethernet. In addition, although illustrated in a particular form factor in FIG. 7, more generally, the module 700 may be configured in any of a variety of different form factors including, but not limited to, the Small Form-factor Pluggable (SFP), the enhanced Small Form-factor Pluggable (SFP+), the 10 Gigabit Small Form-factor Pluggable (XFP), the C Form-factor Pluggable (CFP), and the Quad Small Form-factor Pluggable (QSFP) multi-source agreements (MSAs).

The ROSA 710 may house one or more optical receivers, such as photodiodes, that are electrically coupled to an electrical interface 716. The one or more optical receivers may be configured to convert optical signals received through the receive port 704 into corresponding electrical signals that are relayed to the host device through the electrical interface 716 and the PCB 708. The TOSA 712 may house one or more optical transmitters, such as lasers, that are electrically coupled to another electrical interface 718. The one or more optical transmitters may be configured to convert electrical signals received from the host device by way of the PCB 708 and the electrical interface 718 into corresponding optical signals that are transmitted through the transmit port 706.

The serializer circuit 720, which may be similar to and/or correspond to the serializer circuits 100, 400, and/or 500 of FIGS. 1, 4, and 5, respectively, may be configured to serialize signals relayed to the PCB 708 from the host device. In some embodiments, the serializer circuit 720 may be incorporated into the TOSA 712.

The module 700 illustrated with respect to FIG. 7 is one architecture in which embodiments of the present disclosure may be employed. It should be understood that this specific architecture is only one of countless architectures in which embodiments may be employed. The scope of the present disclosure is not intended to be limited to any particular architecture or environment.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, all examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A serializer circuit, comprising:
   a recovery circuit configured to:
      receive a first data signal at a first frequency,
      generate a first clock signal at the first frequency using the first data signal,
      retime the first data signal based on the first clock signal to generate a retimed first data signal, and
      generate a second clock signal at a second frequency by:
         comparing a phase of the first data signal and a phase of the first clock signal,
         generating a phase signal based on the comparison of the phase of the first data signal and the phase of the first clock signal, and
         generating a filtered signal based on the phase signal, wherein the second clock signal is generated based on the filtered signal;
   an adjusting circuit configured to receive a second data signal and retime the second data signal based on the first clock signal to generate a retimed second data signal; and
   a multiplexer circuit configured to multiplex the retimed first data signal and the retimed second data signal, wherein the multiplexer circuit is configured to multiplex the retimed first data signal and the retimed second data signal using the second clock signal.

2. The serializer circuit of claim 1, wherein the second frequency is twice the first frequency.

3. The serializer circuit of claim 1, wherein the adjusting circuit includes:
   a phase detector configured to compare a phase of the retimed second data signal to a phase of the first clock signal and to generate a phase comparison signal; and
   a retiming element configured to adjust the phase of the second data signal to generate the retimed second data signal based on the phase comparison signal.

4. The serializer circuit of claim 3, wherein the retiming element is a delay element, wherein the delay element adjusts the phase of the second data signal by delaying the second data signal.

5. The serializer circuit of claim 1, wherein the adjusting circuit is a delayed-lock-loop circuit.

6. The serializer circuit of claim 1, wherein the retimed first data signal is phase aligned with the first clock signal such that either a rising edge or falling edge of the first clock signal is aligned between transitions of the retimed first data signal.

7. The serializer circuit of claim 1, wherein the adjusting circuit is a first adjusting circuit, the serializer circuit further comprising a second adjusting circuit configured to receive a third data signal and retime the third data signal based on the first clock signal to generate a retimed third data signal.

8. The serializer circuit of claim 7, further comprising a third adjusting circuit configured to receive a fourth data signal and retime the fourth data signal based on the first clock signal to generate a retimed fourth data signal.

9. The serializer circuit of claim 8, wherein the multiplexer circuit is a first multiplexer circuit, the serializer circuit further comprising a second multiplexer circuit configured to multiplex the retimed third data signal and the retimed fourth data signal, wherein the second multiplexer circuit is configured to multiplex the retimed third data signal and the retimed fourth data signal using the second clock signal.

10. The serializer circuit of claim 7, wherein the multiplexer circuit is configured to multiplex the retimed first data signal, the retimed second data signal, and the retimed third data signal, wherein the multiplexer circuit is configured to multiplex the retimed first data signal, the retimed second data signal, and the retimed third data signal using the second clock signal.

11. A method to serialize data signals, the method comprising:
receiving a first data signal at a first frequency;
receiving a second data signal;
generating a first clock signal at the first frequency using the first data signal;
retiming the first data signal based on the first clock signal to generate a retimed first data signal;
generating a second clock signal at a second frequency by:
comparing a phase of the first data signal and a phase of the first clock signal,
generating a phase signal based on the comparison of the phase of the first data signal and the phase of the first clock signal, and
generating a filtered signal based on the phase signal, wherein the second clock signal is generated based on the filtered signal;
retiming the second data signal based on the first clock signal to generate a retimed second data signal; and
multiplexing the retimed first data signal and the retimed second data signal, wherein the multiplexing of the retimed first data signal and the retimed second data signal is based on the second clock signal.

12. The method of claim 11, wherein the second frequency is twice the first frequency.

13. The method of claim 11, wherein the retimed first data signal is phase aligned with the first clock signal such that either a rising edge or falling edge of the first clock signal is aligned between transitions of the retimed first data signal.

14. The method of claim 11, further comprising:
receiving a third data signal; and
retiming the third data signal based on the first clock signal to generate a retimed third data signal.

15. The method of claim 14, further comprising multiplexing the retimed first data signal, the retimed second data signal, and the retimed third data signal, wherein the multiplexing of the retimed first data signal, the retimed second data signal, and the third data signal is based on the second clock signal.

16. The method of claim 14, further comprising:
receiving a fourth data signal;
retiming the fourth data signal based on the first clock signal to generate a retimed fourth data signal; and
multiplexing the retimed third data signal and the retimed fourth data signal.

17. A serializer circuit, comprising:
a recovery circuit configured to:
receive a first data signal at a first frequency,
generate a first clock signal at the first frequency using the first data signal,
retime the first data signal based on the first clock signal to generate a retimed first data signal, wherein the retimed first data signal is phase aligned with the first clock signal such that the retimed first data signal and the first clock signal have a known phase relationship, and
generate a second clock signal at a second frequency by:
comparing a phase of the first data signal and a phase of the first clock signal,
generating a phase signal based on the comparison of the phase of the first data signal and the phase of the first clock signal, and
generating a filtered signal based on the phase signal, wherein the second clock signal is generated based on the filtered signal;
an adjusting circuit configured to receive a second data signal and retime the second data signal based on the first clock signal to generate a retimed second data signal, wherein the retimed second data signal is phase aligned with the first clock signal such that the retimed second data signal and the first clock signal have the same known phase relationship as the retimed first data signal and the first clock signal; and
a multiplexer circuit configured to multiplex the retimed first data signal and the retimed second data signal, wherein the multiplexer circuit is configured to multiplex the retimed first data signal and the retimed second data signal using the second clock signal.

18. The serializer circuit of claim 17, wherein the recovery circuit includes an Alexander phase detector configured to compare the first data signal with the first clock signal, wherein the second clock signal is generated based on the comparison of the first data signal with the first clock signal.

* * * * *